(12) United States Patent
Ban et al.

(10) Patent No.: US 8,999,862 B1
(45) Date of Patent: Apr. 7, 2015

(54) METHODS OF FABRICATING NANO-SCALE STRUCTURES AND NANO-SCALE STRUCTURES FABRICATED THEREBY

(71) Applicant: SK Hynix Inc., Icheon (KR)

(72) Inventors: Keun Do Ban, Yongin (KR); Cheol Kyu Bok, Pohang (KR); Myoung Soo Kim, Seongnam (KR); Jung Hyung Lee, Seoul (KR); Hyun Kyung Shim, Seoul (KR); Chang Il Oh, Seongnam (KR)

(73) Assignee: SK Hynix Inc., Icheon (KR)

( * ) Notice: Subject to any disclaimer, the term of this patent is extended or adjusted under 35 U.S.C. 154(b) by 0 days.

(21) Appl. No.: 14/247,063

(22) Filed: Apr. 7, 2014

(30) Foreign Application Priority Data

Dec. 2, 2013 (KR) .......................... 10-2013-0148251

(51) Int. Cl.
*H01L 21/31* (2006.01)
*H01L 21/469* (2006.01)
*H01L 21/033* (2006.01)
*H01L 21/306* (2006.01)

(52) U.S. Cl.
CPC ...... *H01L 21/0332* (2013.01); *H01L 21/30604* (2013.01)

(58) Field of Classification Search
USPC ......... 438/780, 700, 725, 733, 555, 270, 637, 438/381; 257/E21.006, E21.007, E21.027, 257/E21.058, E21.077, E21.206, E21.231, 257/E21.259, E21.264, E21.266, E21.267, 257/E21.645, E21.646
See application file for complete search history.

(56) References Cited

U.S. PATENT DOCUMENTS

2006/0186424 A1* 8/2006 Fujimoto et al. ................. 257/98
2007/0099227 A1* 5/2007 Curry et al. ....................... 435/6
2011/0293879 A1* 12/2011 Shenhar et al. ............... 428/105

FOREIGN PATENT DOCUMENTS

KR 10-2010-0079948 A 7/2010

* cited by examiner

*Primary Examiner* — David Nhu

(57) ABSTRACT

Methods of fabricating nano-scale structures are provided. A method includes forming a first hard mask pattern corresponding to first openings in a dense region, forming first guide elements on the first hard mask pattern aligned with the first openings, and forming second hard mask patterns in a sparse region to provide isolated patterns. A blocking layer is formed in the sparse region to cover the second hard mask patterns. A first domain and second domains are formed in the dense region using a phase separation of a block co-polymer layer. Related nano-scale structures are also provided.

20 Claims, 20 Drawing Sheets

US 8,999,862 B1

METHODS OF FABRICATING NANO-SCALE STRUCTURES AND NANO-SCALE STRUCTURES FABRICATED THEREBY

CROSS-REFERENCE TO RELATED APPLICATION

The present application claims priority under 35 U.S.C 119(a) to Korean Application No. 10-2013-0148251, filed on Dec. 2, 2013, in the Korean Intellectual Property Office, which is incorporated herein by reference in its entirety.

BACKGROUND

In fabrication of electronic devices such as semiconductor devices, many efforts have been focused on integrating more patterns in a limited area of a semiconductor substrate. That is, attempts to increase the integration density of electronic devices such as semiconductor devices have typically focused on formation of fine patterns. Various techniques have been proposed to form fine patterns, such as small contact holes having a nano-scale critical dimension (CD) with a size of about a few nanometers to about several tens of nanometers. In the event that the fine patterns of the semiconductor devices are formed using only a photolithography process, there may be some limitations in forming the fine patterns due to image resolution limits of lithography apparatuses used in the photolithography process.

Methods of forming fine patterns using self-assembly of polymer molecules may be considered as a candidate for overcoming the image resolution limits of optical systems used in the photolithography process and for overcoming wavelengths of lights generated from light sources of optical systems used in the photolithography process. However, methods of forming fine patterns using self-assembly techniques are in development. Thus, there are still some difficulties in forming the fine patterns of highly integrated semiconductor devices using self-assembly techniques.

SUMMARY

Various embodiments are directed to methods of fabricating nano-scale structures and to nano-scale structures fabricated thereby.

According to some embodiments, a method of fabricating a nano-scale structure includes forming a first preliminary mask pattern defining first openings and second preliminary mask patterns providing isolated patterns on a hard mask layer, forming first guide elements on sidewalls of the first openings and second guide elements on sidewalls of the second preliminary mask patterns, etching the hard mask layer using the first and second guide elements and the first and second preliminary mask patterns as etch masks to form a first hard mask pattern into which the first openings extend and second hard mask patterns having shapes of the isolated patterns, removing the first and second preliminary mask patterns, forming a blocking layer covering the second hard mask patterns, forming a block co-polymer layer filling the first openings with sidewalls defined by the first guide elements and spaces between the first guide elements, and phase-separating the block co-polymer layer to form first and second domains in the spaces between the first guide elements.

According to further embodiments, a method of fabricating a nano-scale structure includes providing a first hard mask pattern defining lower portions of first openings, first guide elements disposed on the first hard mask pattern and aligned with the first openings, and second hard mask patterns corresponding to isolated patterns, forming a blocking layer covering the second hard mask patterns, forming a block co-polymer layer filling the first openings and a space between the first guide elements, and phase-separating the block co-polymer layer to form a first domain and second domains in the space between the first guide elements.

According to further embodiments, a method of fabricating a nano-scale structure includes providing a first hard mask pattern defining first openings and second hard mask patterns corresponding to isolated patterns, forming a blocking layer covering the second hard mask patterns, forming a block co-polymer layer covering the first hard mask pattern, and phase-separating the block co-polymer layer to form a first domain and second domains on a portion of the first had mask pattern between the first openings.

According to further embodiments, a method of fabricating a nano-scale structure includes providing a first hard mask pattern defining lower portions of first openings in a dense region, providing first guide elements on the first hard mask pattern, the guide elements defining upper portions of the first openings, providing second hard mask patterns in a sparse region, each second hard mask pattern corresponding to an isolated pattern, forming a blocking layer covering the second hard mask patterns in the sparse region, and forming a first domain and second domains in the dense region using a phase separation of a block co-polymer layer.

According to further embodiments, a nano-scale structure includes a first hard mask pattern defining first openings, a second hard mask pattern corresponding to an isolated pattern, first guide elements disposed on the first had mask pattern and aligned with the first openings, a blocking layer covering the second had mask pattern, a first domain disposed in a space between the first guide elements, and second domains in spaces defined by the first domain, wherein the first and second domains are obtained by a phase separation of a block co-polymer layer.

BRIEF DESCRIPTION OF THE DRAWINGS

Embodiments of the present disclosure will become more apparent in view of the attached drawings and accompanying detailed description, in which.

DETAILED DESCRIPTION OF THE EMBODIMENTS

Figure 1:
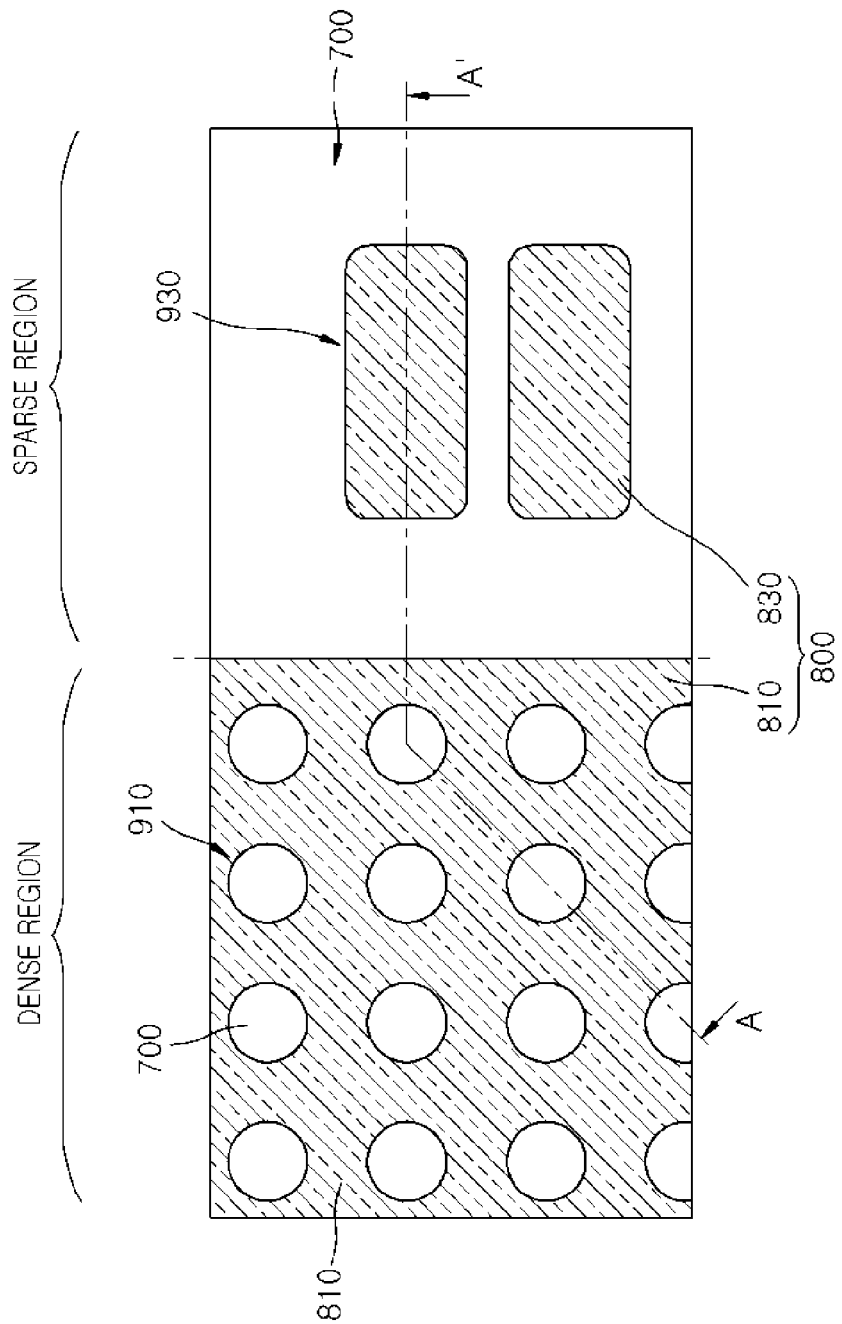
FIGS. 1, 3, 5, 7, 9, 11, 13, 15, 17 and 19 are plan views illustrating methods of fabricating nano-scale structures according to some embodiments of the present disclosure and nano-scale structures fabricated thereby.

It will be understood that although the terms first, second, third etc. may be used herein to describe various elements, these elements are not limited by these terms. These terms are only used to distinguish one element from another element. Thus, a first element in some embodiments could be termed a second element in other embodiments without departing from the teachings of the present disclosure. As used herein, the term "and/or" includes any and all combinations of one or more of the associated listed items.

It will also be understood that when an element is referred to as being located "under", "beneath", "below", "lower", "on", "over", "above", "upper", "side" or "aside" another element, it can be directly contact the other element, or at least one intervening element may also be present therebetween.

Accordingly, terms such as "under", "beneath", "below", "lower", "on", "over", "above", "upper", "side", "aside" and the like which are used herein are for the purpose of describing particular embodiments only and are not intended to limit the scope of the present disclosure.

Various embodiments of the present disclosure may provide methods of fabricating nano-scale structures of semiconductor devices by self-assembling domains of a block copolymer (BCP) material. The nano-scale structures may have one or more feature with a size of about a few nanometers to about several tens of nanometers. The nano-scale structures, which may be repeatedly arrayed, may be obtained by phase-separating polymer blocks or polymer components of a BCP material and by self-assembling the phase-separated domains of the BCP material in regular sizes. In the event that the nano-scale structures are formed using a self-assembly of domains of a BCP material, the nano-scale structures may have a size or dimension which is similar to a thickness of a single molecular layer. As a result, a resolution limit of a photolithography process may be overcome by the self-assembly of the domains of the BCP material.

Storage nodes constituting cell capacitors of dynamic random access memory (DRAM) devices may be arrayed in cell array regions to be denser than patterns formed in peripheral circuit regions. As a result, the patterns formed in the peripheral circuit regions may be arrayed to be less dense than storage nodes formed in cell array regions. If cell contact holes defining a shape of the storage nodes are formed in cell array regions according to embodiments of the present disclosure, the cell contact holes may be repeatedly arrayed to have small and uniform sizes in the cell array regions whereas isolated patterns may be formed in peripheral circuit regions at a lower density than the cell contact holes. In addition, according to some embodiments, the cell contact holes located towards edges of cell array regions may have substantially the same size as cell contact holes located in central parts of the cell array regions. That is, the cell contact holes may have a uniform size throughout the cell array regions.

Methods according to embodiments of the present disclosure may be applied to form various semiconductor devices, for example, phase changeable random access memory (PcRAM) devices or resistive random access memory (ReRAM) devices including an array of nano-scale cell storage nodes. That is, methods according to embodiments of the present disclosure may be applied to form cell contact holes in which cell storage nodes are disposed. Further, methods according to embodiments of the present disclosure may also be used in fabrication of fine patterns which are regularly and repeatedly arrayed in memory devices such as static random access memory (SRAM) devices, flash memory devices, magnetic random access memory (MRAM) devices and ferroelectric random access memory (FeRAM) devices, or in logic devices.

Figure 2:
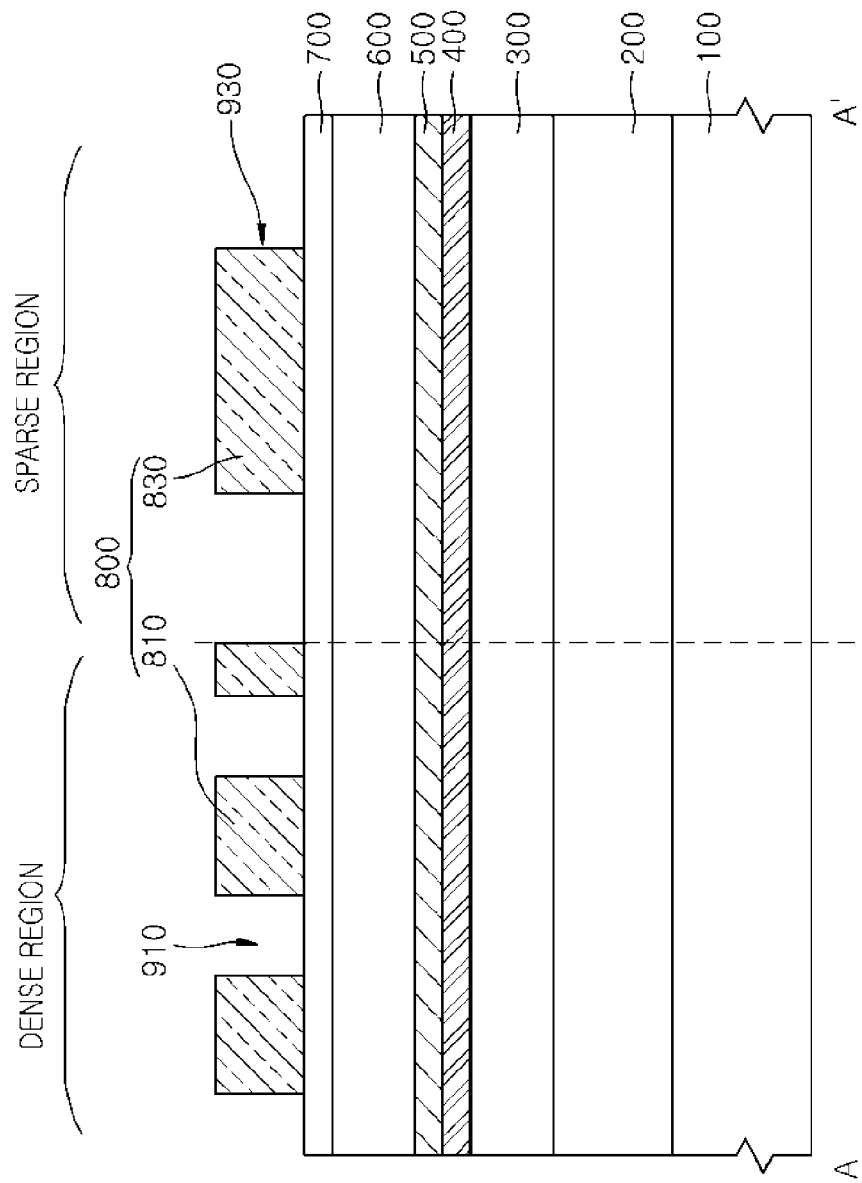
FIGS. 2, 4, 6, 8, 10, 12, 14, 16, 18 and 20 are cross-sectional views taken along lines A-A' of FIGS. 1, 3, 5, 7, 9, 11, 13, 15, 17 and 19, respectively.

Referring to FIGS. 1 and 2, an etch target layer 200, a first etch mask layer 300, a second etch mask layer 400, a hard mask layer 500, a preliminary mask layer 600 and a capping layer 700 may be sequentially formed on a semiconductor substrate 100. A photoresist pattern 800 may then be formed on the capping layer 700. The photoresist pattern 800 may be formed using a photolithography process that is performed with an optical pattern transfer technique. A substrate that facilitates formation of nano-scale structures can be used as the semiconductor substrate 100. Switching elements such as transistors and/or conductive patterns such as interconnection lines may be formed between the semiconductor substrate 100 and the etch target layer 200.

The etch target layer 200 may be formed of an interlayer insulation layer such as a silicon oxide layer. For example, the etch target layer 200 may be formed of a tetra-ethyl-ortho-silicate (TEOS) layer having a thickness of about 2200 angstroms. The etch target layer 200 may electrically insulate storage node contact plugs from each other. The storage node contact plugs may electrically connect storage nodes of cell capacitors of semiconductor devices (e.g., DRAM devices) to the semiconductor substrate 100 or cell transistors (not shown) formed on the semiconductor substrate 100.

In some embodiments, the etch target layer 200 may be used as a molding layer that is penetrated by contact holes defining a shape of storage nodes of cell capacitors of the semiconductor devices (e.g., DRAM devices). Alternatively, the etch target layer 200 may be used as an interlayer insulation layer that lower electrodes contacting cell resistive layers of ReRAM devices penetrate. The contact holes may penetrate the etch target layer 200, and the etch target layer 200 may also be patterned to provide nano-scale structures.

The first etch mask layer 300 used in patterning the etch target layer 200 may include an amorphous carbon layer having a thickness of about 1500 angstroms. The second etch mask layer 400 may be formed on the first etch mask layer 300 to transfer desired patterns to the first etch mask layer 300. The second etch mask layer 400 may include a silicon oxynitride (SiON) layer having a thickness of about 200 angstroms. The second etch mask layer 400 may be used to transfer the patterns formed in the hard mask layer 500 to the first etch mask layer 300. Thus, the second etch mask layer 400 may be formed of a material which is different from materials of the first etch mask layer 300 and the hard mask layer 500.

The hard mask layer 500 may include a silicon oxide layer such as an undoped silicate glass (USG) layer having a thickness of about 200 angstrom. Fine patterns corresponding to the nano-scale structures which are realized in the etch target layer 200 in a subsequent process may be formed in the hard mask layer 500.

The preliminary mask layer 600 may be formed on the hard mask layer 500, and may include a high temperature spin on carbon (SOC) layer having a thickness of about 800 angstroms. When the preliminary mask layer 600 is formed of an SOC layer, the capping layer 700 covering a top surface of the preliminary mask layer 600 may include a silicon oxide layer such as a USG layer having a thickness of about 200 angstroms.

A photoresist layer may then be formed on the capping layer 700, and a photolithography process may be performed to transfer desired pattern images onto the photoresist layer. As a result of the photolithography process, the photoresist pattern 800 may be formed on the capping layer 700. The photoresist pattern 800 may be formed using a single photolithography step that is performed with a single photo mask.

The photoresist pattern 800 may include a first photoresist pattern 810 formed in a dense region of a semiconductor device and a second photoresist pattern 830 formed in a sparse region of the semiconductor device. The dense region and the sparse region may correspond to a cell array region and a peripheral circuit region, respectively. The first photoresist pattern 810 may define a plurality of holes such as contact holes which are repeatedly arrayed at a predetermined pitch and may penetrate the layer in which they are formed. The second photoresist pattern 830 may define isolated patterns which may be separated from each other by a distance which is greater than a distance between the holes arrayed in the dense region. In other words, the density of second photoresist patterns 830 in the sparse region may be lower than the density of first photoresist patterns 810 in the dense region.

According to an embodiment, the first photoresist pattern 810 may provide an array of openings 910 in the dense region and the second photoresist pattern 830 may provide isolated patterns 930 in the sparse region. A size of each of the openings 910 may be greater than a size of corresponding openings which are formed in a subsequent process. The first photoresist pattern 810 defining the openings 910 and the second photoresist pattern 830 providing the isolated patterns 930 may be simultaneously formed using a single photolithography step performed with a single photo mask. The opening 910 may be holes which have a width of about 35 nanometers to about 59 nanometers. In an embodiment, the openings 910 may be holes having a width of about 40 nanometers to about 42 nanometers.

Figure 3:
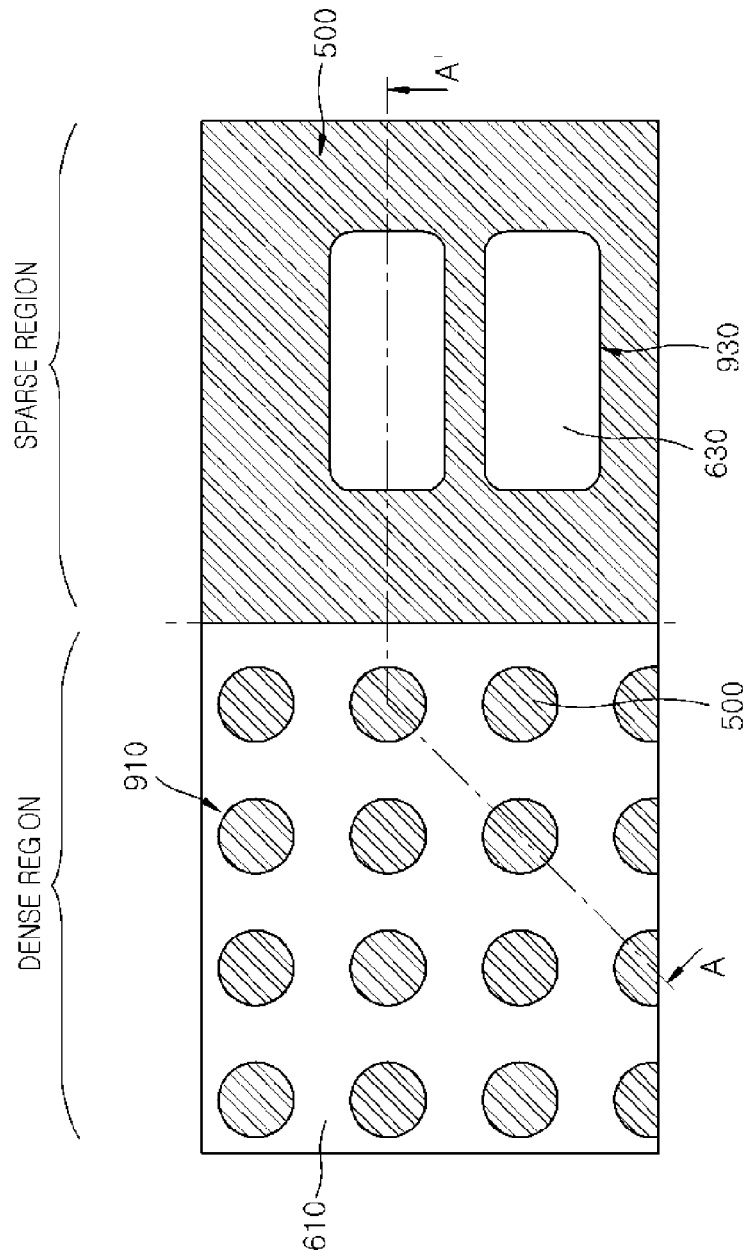
Figure 4:
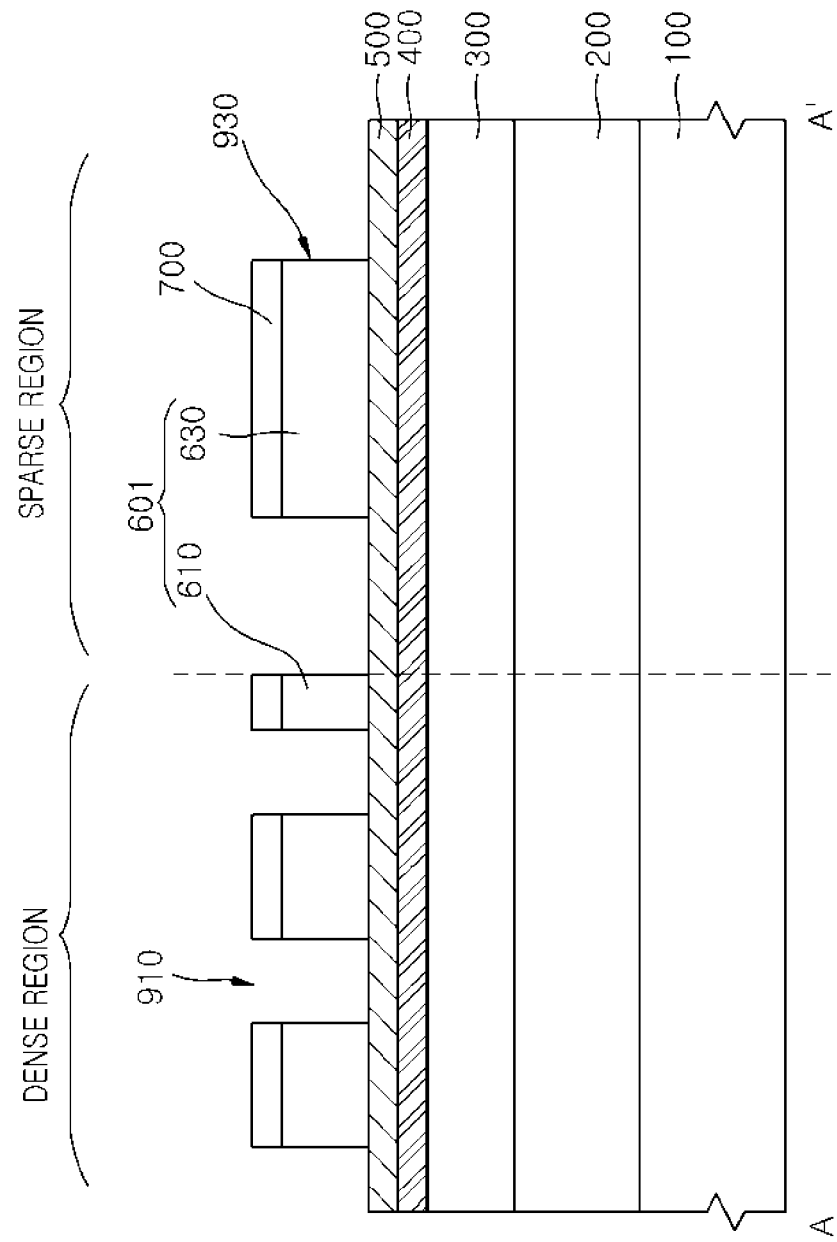

Referring to FIGS. 3 and 4, the capping layer 700 and the preliminary mask layer 600 may be etched using the photoresist pattern 800 as an etch mask, thereby forming a preliminary mask pattern 601. The preliminary mask pattern 601 may include a first preliminary mask pattern 610 defining through holes corresponding to the openings 910 and a second preliminary mask pattern 630 providing patterns corresponding to the isolated patterns 930. The first and second preliminary mask patterns 610 and 630 may be simultaneously formed using a single etch step.

The openings 910 may correspond to preliminary holes for forming actual holes in a lower layer in a subsequent process. The holes may penetrate a layer of the substrate. The openings 910 may include a plurality of holes which may be arranged in a regular pattern. In some embodiments, openings 910 have a trench line or a groove line shape which have a length dimension that is significantly longer than a width dimension. In an embodiment, the openings 910 may have substantially the same size and may be regularly arranged in an array with a predetermined pitch.

The isolated patterns 930 provided by the second preliminary mask pattern 630 may be spaced apart from each other by a distance which is greater than a distance between the openings 910. The isolated patterns 930 may have, for example, isolated line shapes or isolated rectangular shapes. These isolated patterns 930 may be used to form circuit patterns constituting a peripheral circuit that is disposed in the sparse region (i.e., the peripheral circuit region) and controls operations of memory cells formed in the dense region (i.e., the cell array region).

Figure 5:
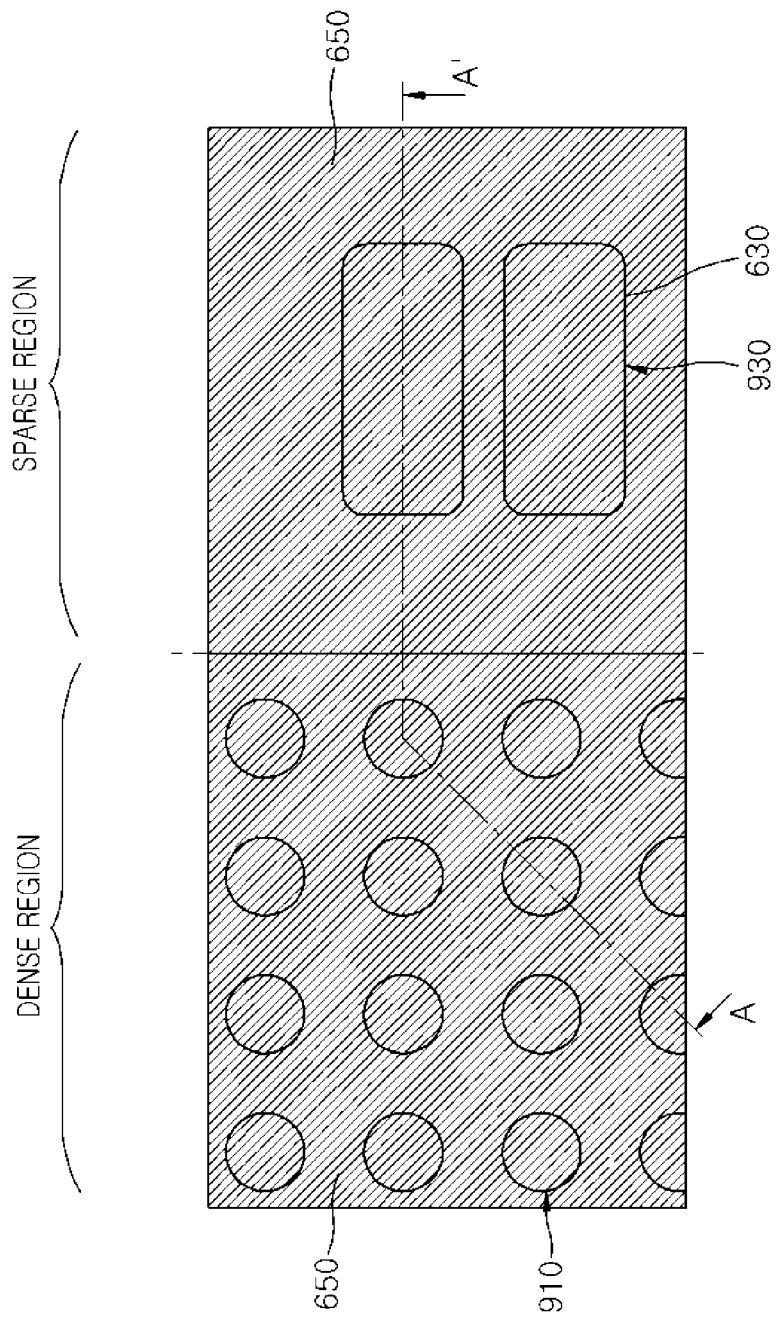
Figure 6:
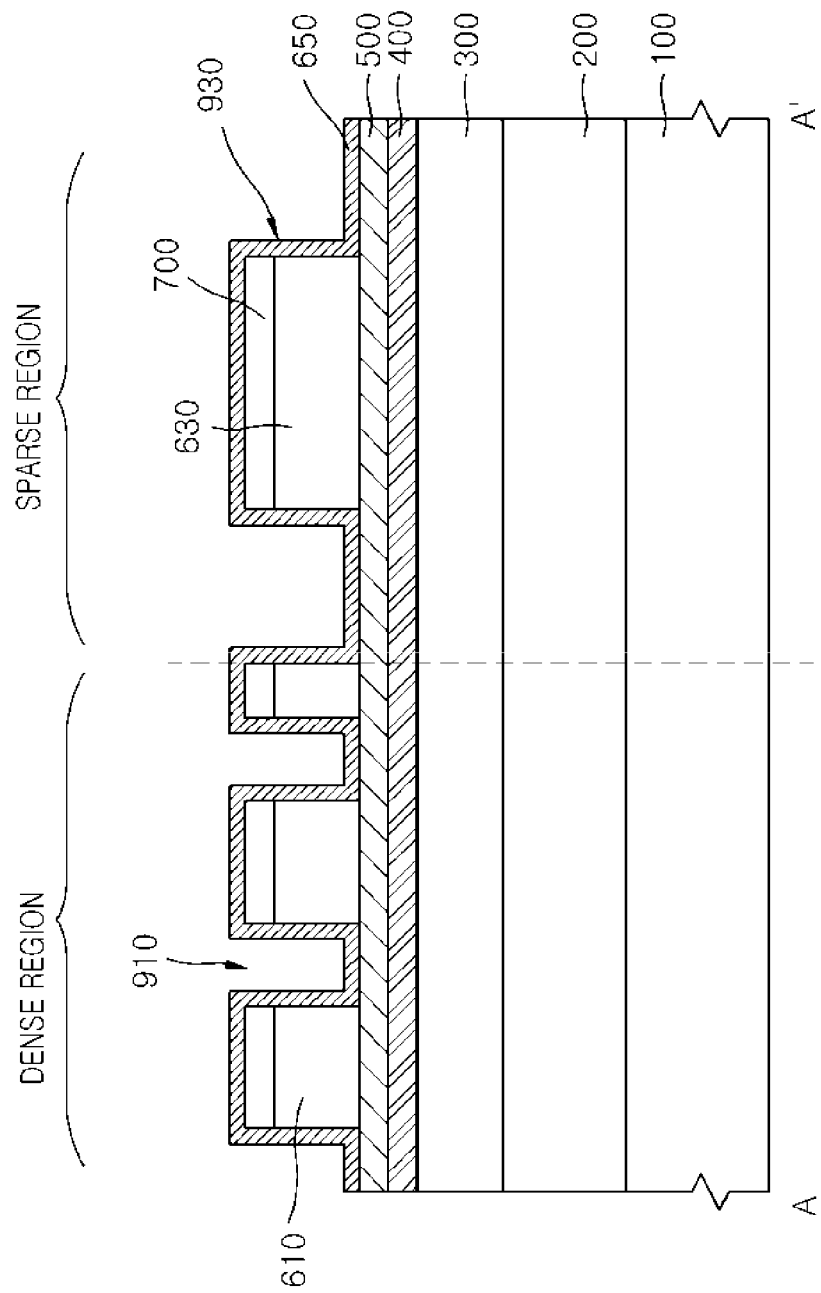

Referring to FIGS. 5 and 6, a guide layer 650 may be formed to conformably cover an entire surface of the substrate including the first and second preliminary mask patterns 610 and 630. The guide layer 650 may provide a guide pattern that defines a location of one or more polymer domains which are generated when a block co-polymer (BCP) layer is phase-separated in a subsequent process. The guide layer 650 may be an insulation layer having an etch selectivity with respect to the preliminary mask pattern 601. For example, the guide layer 650 may be formed of a silicon oxide layer such as an ultra low temperature oxide (ULTO) layer having a thickness of about 200 angstroms. The ULTO material may have excellent conformability characteristics. Thus, when the guide layer 650 is an ULTO layer, the guide layer 650 may conformally cover a top surface of the substrate including the first and second preliminary mask patterns 610 and 630.

Figure 7:
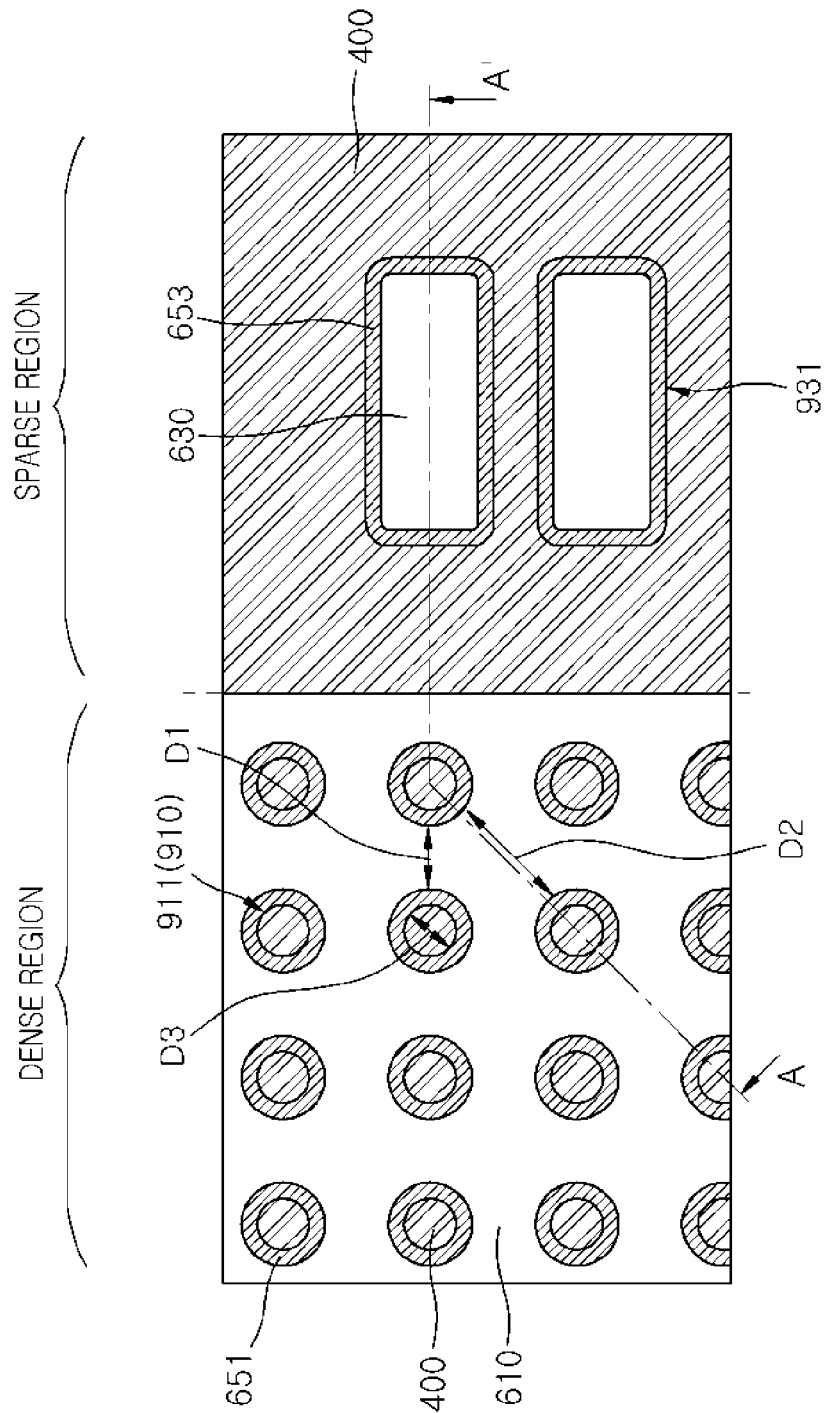
Figure 8:
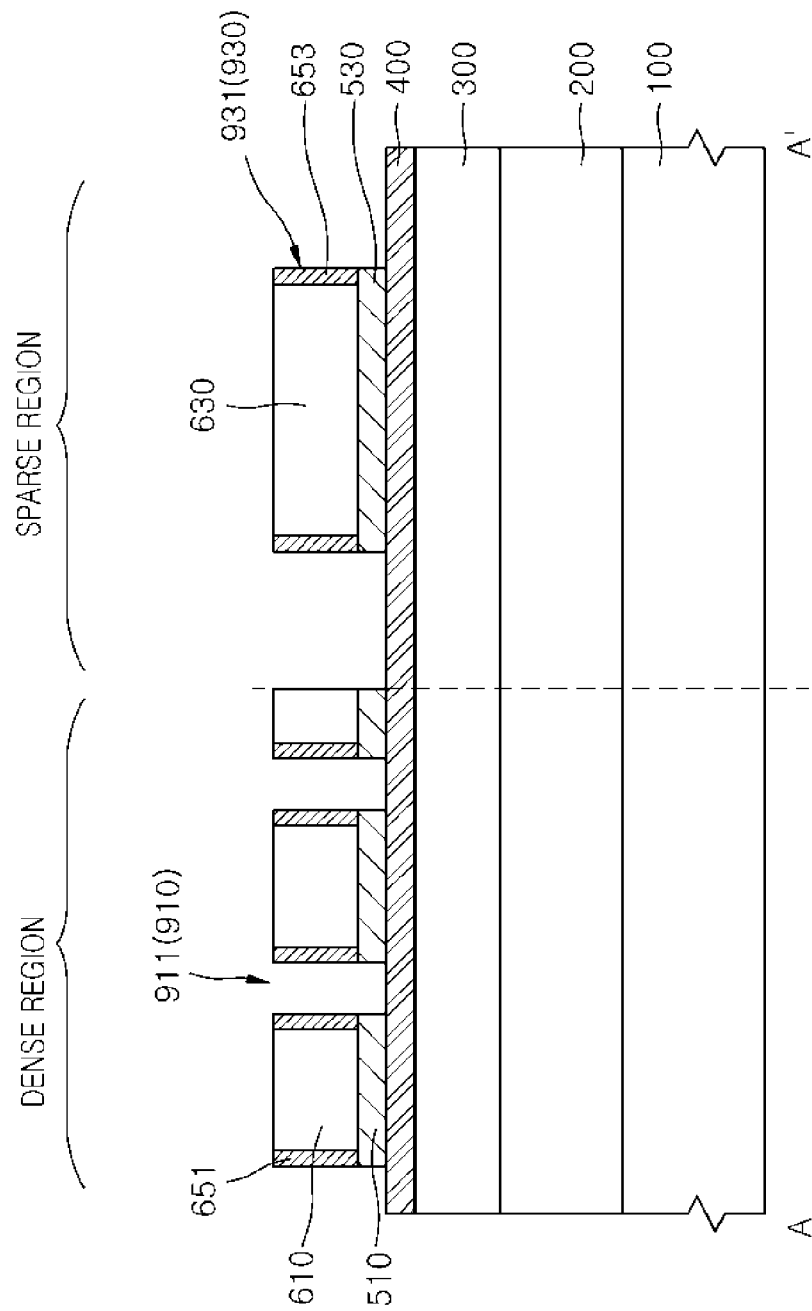

Referring to FIGS. 7 and 8, the guide layer 650 may be anisotropically etched to form first guide elements 651 disposed on sidewalls of the first preliminary mask pattern 610 and second guide elements 653 disposed on sidewalls of the second preliminary mask patterns 630. In an embodiment in which the first guide elements 651 are formed on sidewalls of the first preliminary mask pattern 610, a width of each of the first openings 911 surrounded by the first guide elements 651 may be less than a width of each of the openings 910.

Each of the first guide elements 651 may have a cylindrical shape that provides the first openings 911 surrounded thereby. When viewed from above such as in the plan view of FIG. 7, the first guide elements 651 may be arrayed such that a first distance D1 between adjacent first guide elements 651 arrayed in a row direction or a column direction is less than a second distance D2 between the first guide elements 651 arrayed along a diagonal line. The row and column directions may be defined with respect to a boundary between the dense region and the sparse region, or with respect to one or more edge of a resulting semiconductor device. For example, in an embodiment in which a semiconductor substrate has a rectangular shape, the column direction may be parallel with two opposing sides of the rectangle, while the row direction is orthogonal to the row direction. The diagonal line direction may be diagonal relative to the row and column directions.

A size of each of the first openings 911 may be less than a size of each of the openings 910 because of the presence of the first guide elements 651, as described above. Thus, when a block co-polymer (BCP) layer is phase-separated in a subsequent process, a phase separation of two separate polymer domains comprising different polymer blocks may be prohibited in the first openings 911 due to their relatively small size.

In an embodiment, portions of a BCP layer disposed between the first guide elements 651 arrayed along a diagonal line may be more readily phase-separated than portions of the BCP layer disposed between adjacent guide elements in a row direction or a column direction. That is, because the second distance D2 is greater than the first distance D1, portions of a BCP layer between the first guide elements 651 arrayed along a diagonal line may be more readily phase-separated. In contrast, because the first distance D1 is less than the second distance D2, a phase separation of a BCP layer between the first guide elements 651 arrayed in a row or a column may be restricted relative to the diagonal direction. Accordingly, in some embodiments, phase separations of the BCP layer according to the locations may be controlled by adjusting the first and second distances D1 and D2 as well as a volume ratio between two different polymer blocks constituting the BCP layer.

The second guide elements 653 may be formed on the sidewalls of the second preliminary mask patterns 630, as described above. Thus, widths of isolated patterns 931 including the isolated patterns 930 and the second guide elements 653 may be greater than the widths of the isolated patterns 930.

Referring again to FIGS. 7 and 8, the hard mask layer 500 may be etched using the first and second preliminary mask patterns 610 and 630 and the first and second guide elements 651 and 653 as etch masks, thereby forming a first hard mask pattern 510 in the dense region and second hard mask patterns 530 in the sparse region. The first hard mask pattern 510 may be aligned with the first preliminary mask patterns 610 and the first guide elements 651 and may provide the first opening 911 surrounded thereby. The second hard mask patterns 530 may be aligned with the second preliminary mask patterns 630 and the second guide elements 653 constituting the isolated patterns 931. While the hard mask layer 500 is etched, the capping layer 700 on the preliminary mask patterns 610 and 630 may be removed to expose top surfaces of the first and second preliminary mask patterns 610 and 630.

Figure 9:
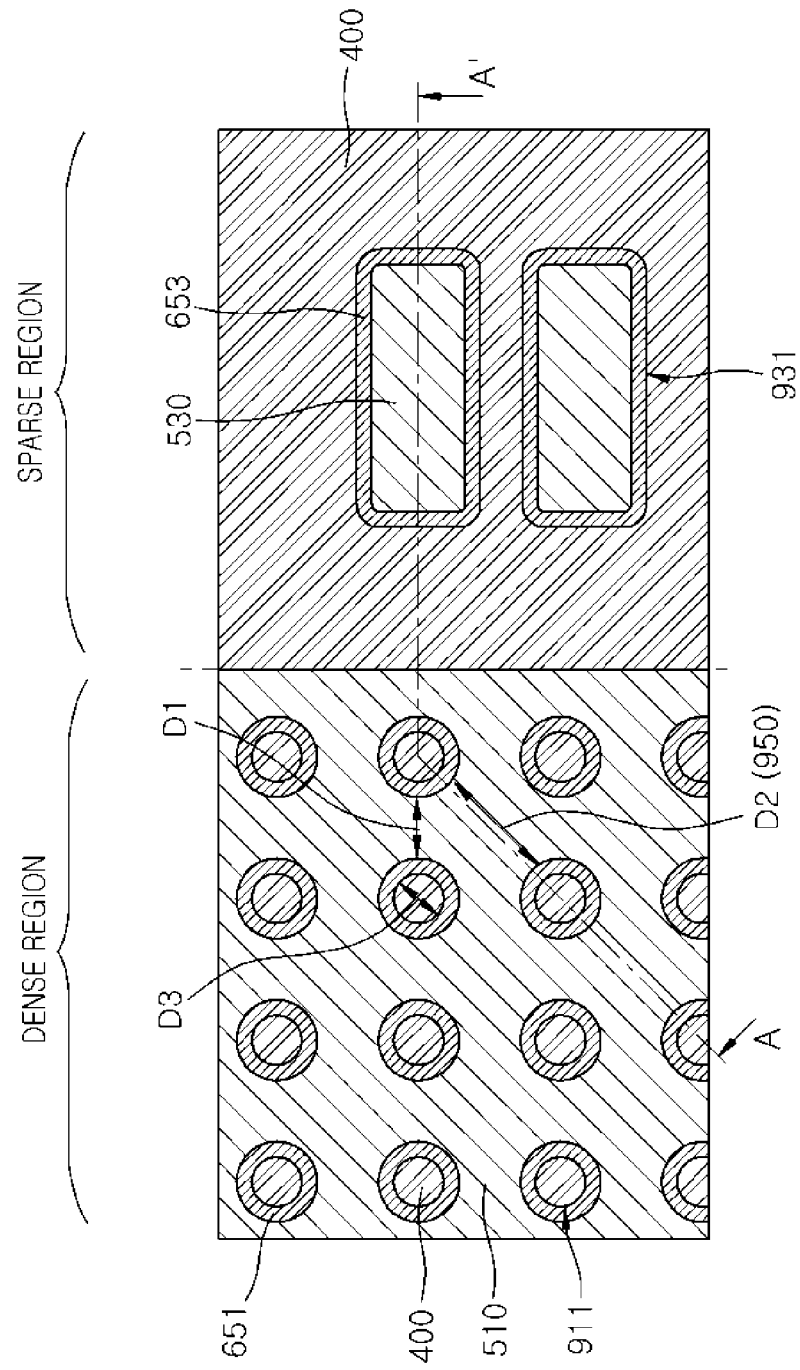
Figure 10:
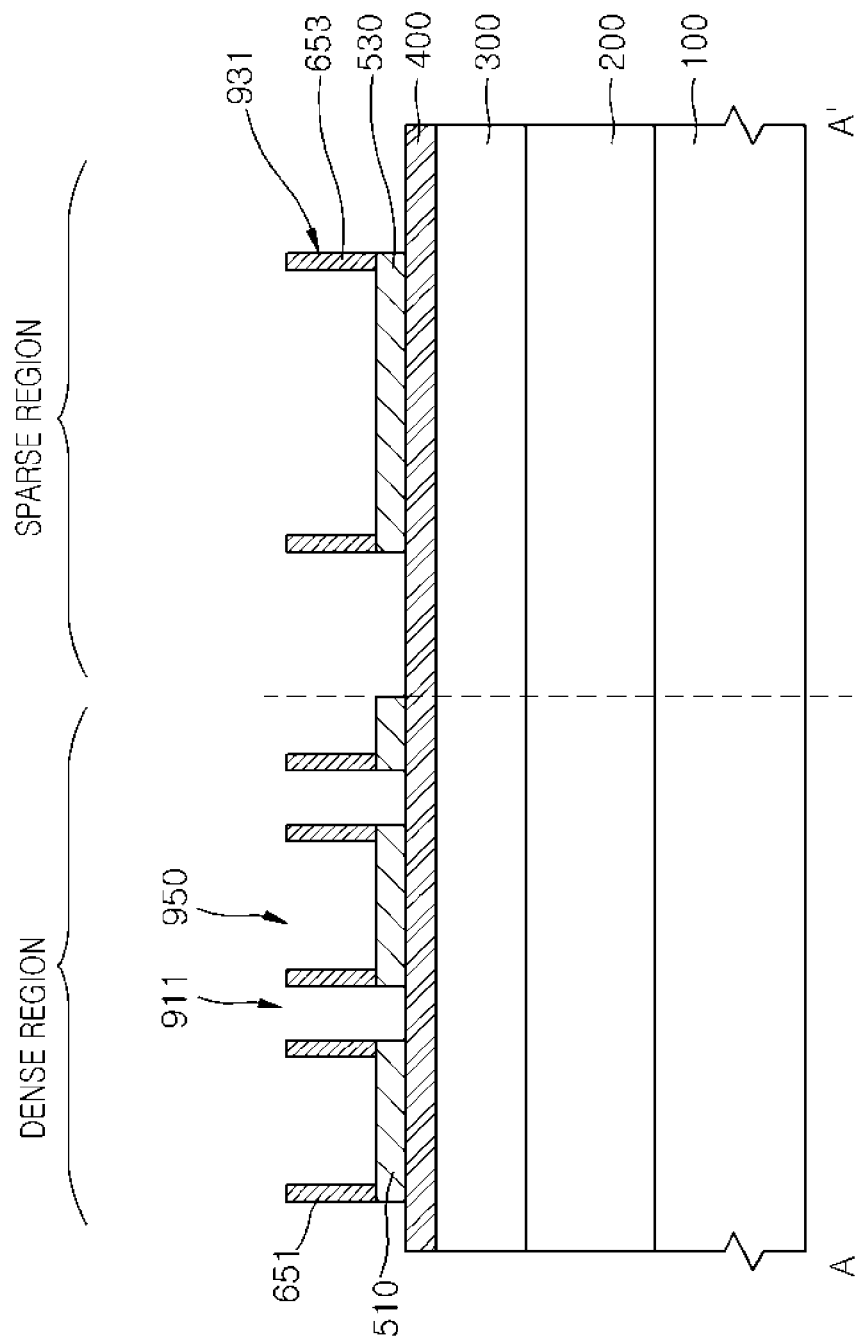

Referring to FIGS. 9 and 10, the first and second preliminary mask patterns 610 and 630 may be removed. As a result, concave regions 950 may be formed between the first guides 651 having cylindrical shapes. The concave regions 950 may provide spaces in which two different polymer components of a BCP layer are phase-separated into two different domains. However, phase separation of two different polymer components of the BCP layer may be restricted in the first openings 911 because each of the first openings 911 has a narrow and small space compared with spaces of concave regions 950. Thus, the first guide elements 651 may act as guide patterns that guide a phase separation of the BCP layer. The second hard mask patterns 530 may be used as etch masks to define shapes of structures that are present in a finalized semiconductor device. Accordingly, isolated patterns 931 may be formed on upper layers and transferred to underlying layers in a fabrication process.

Figure 11:
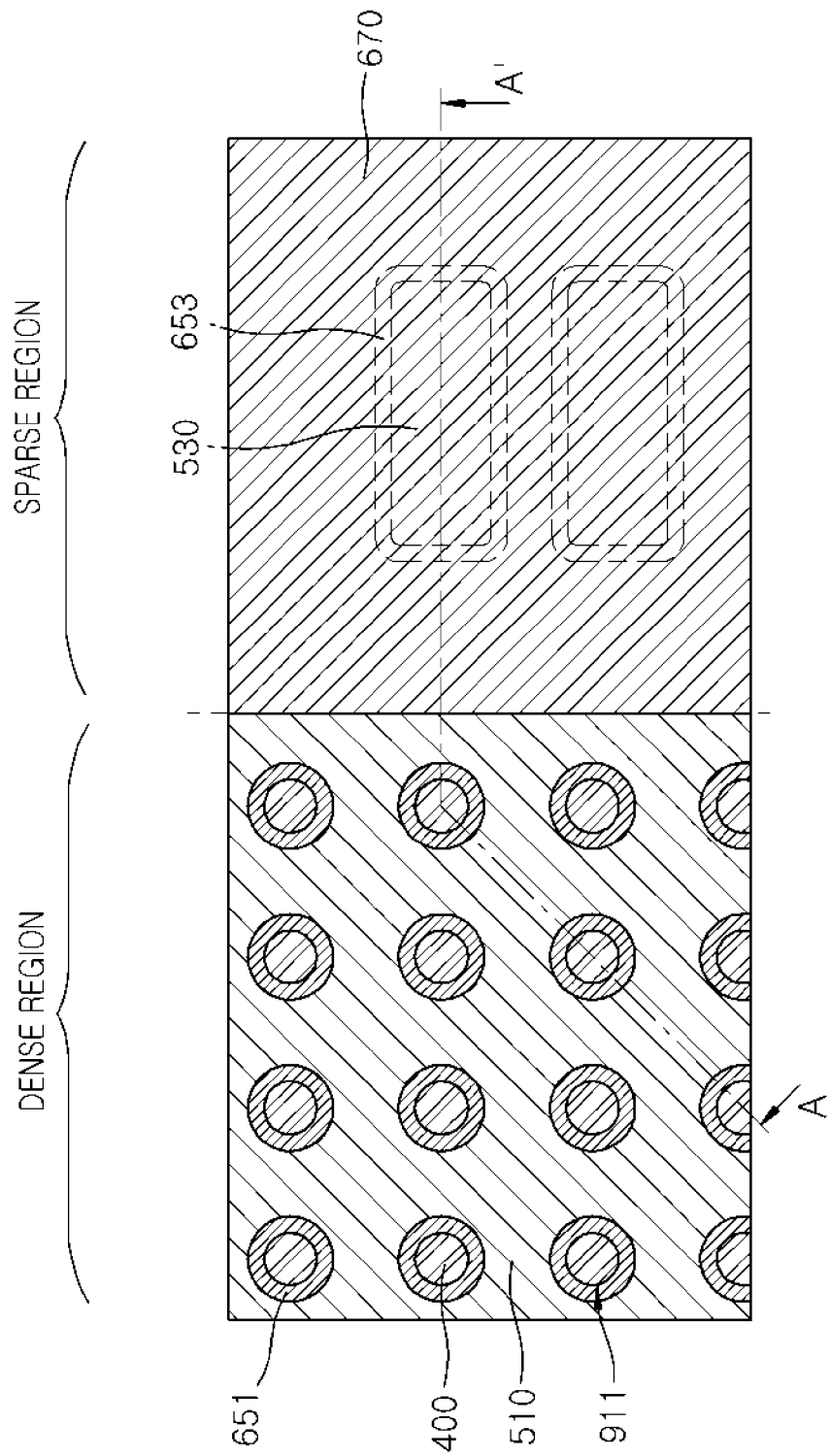
Figure 12:
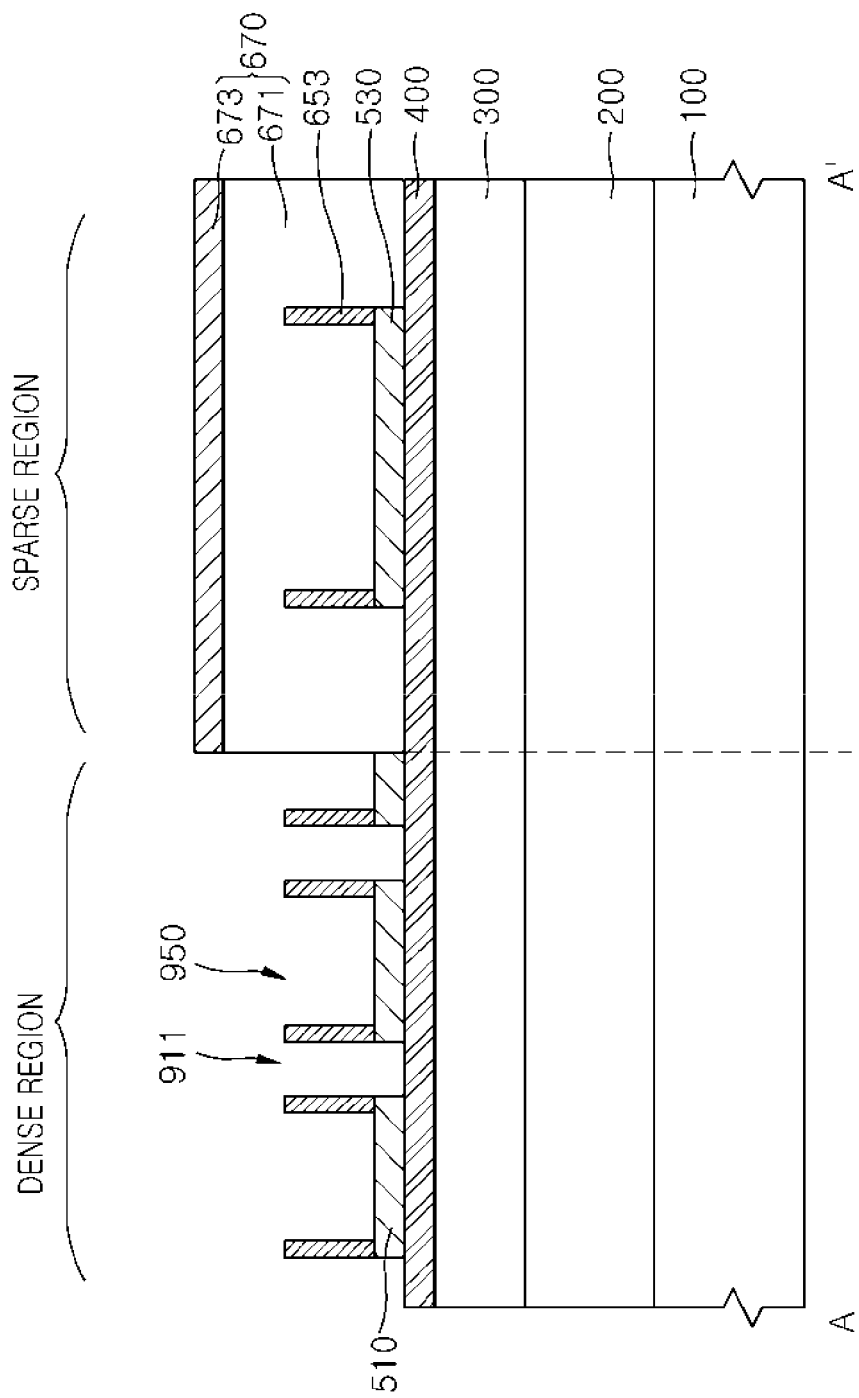

Referring to FIGS. 11 and 12, a blocking layer 670 may be formed to cover and protect the second hard mask patterns 530 that substantially provide the isolated patterns 931. In an embodiment, a high temperature SOC layer 671 may be formed in both the dense region and the sparse region. Subsequently, a silicon oxide layer 673 such as a USG layer having a thickness of about 200 angstroms may be formed on the high temperature SOC layer 671. The silicon oxide layer 673 and the high temperature SOC layer 671 may be patterned to remove a portion disposed over the dense region, thereby forming blocking layer 670 that covers the sparse region and exposes the dense region.

Figure 13:
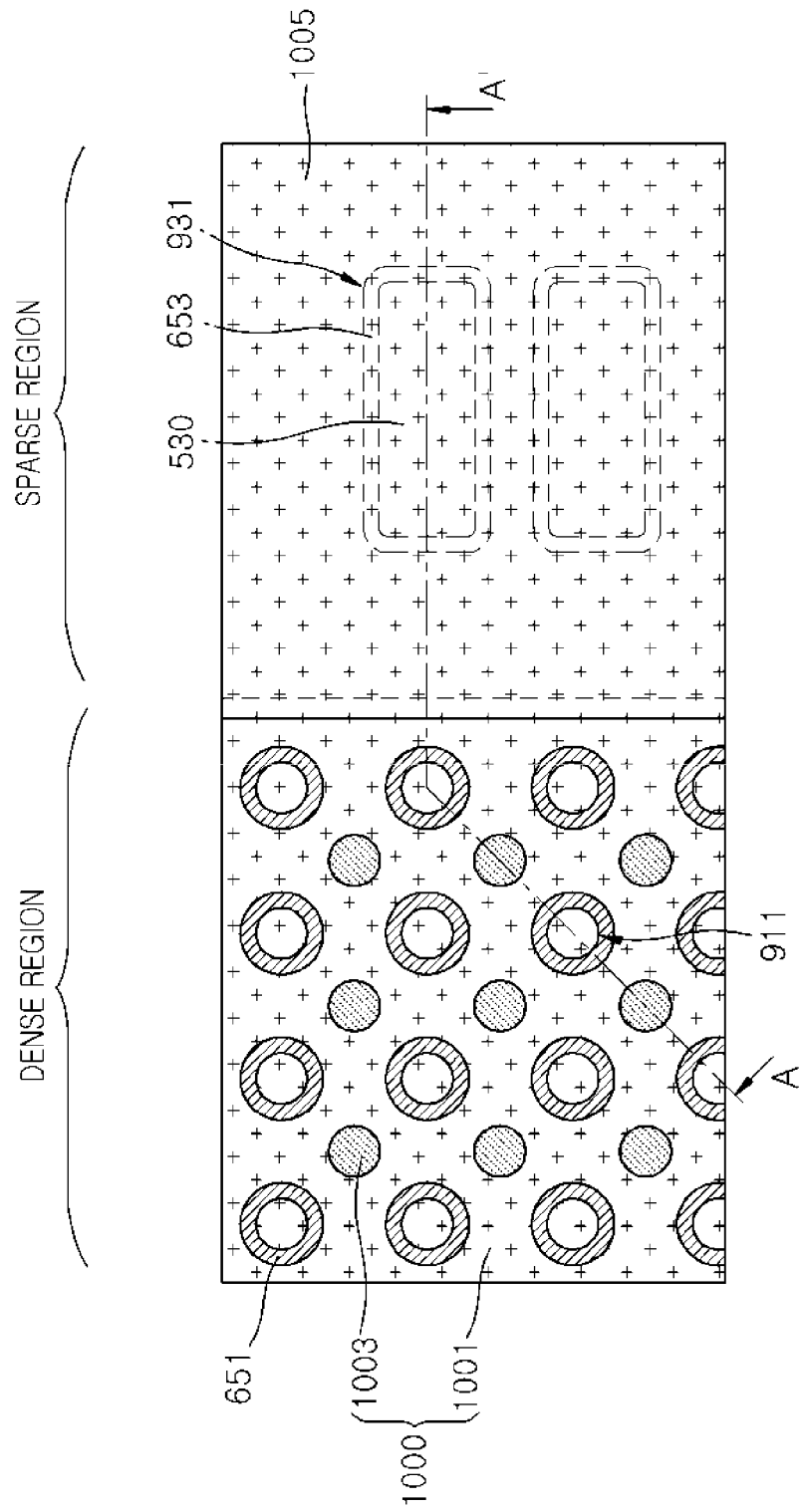
Figure 14:
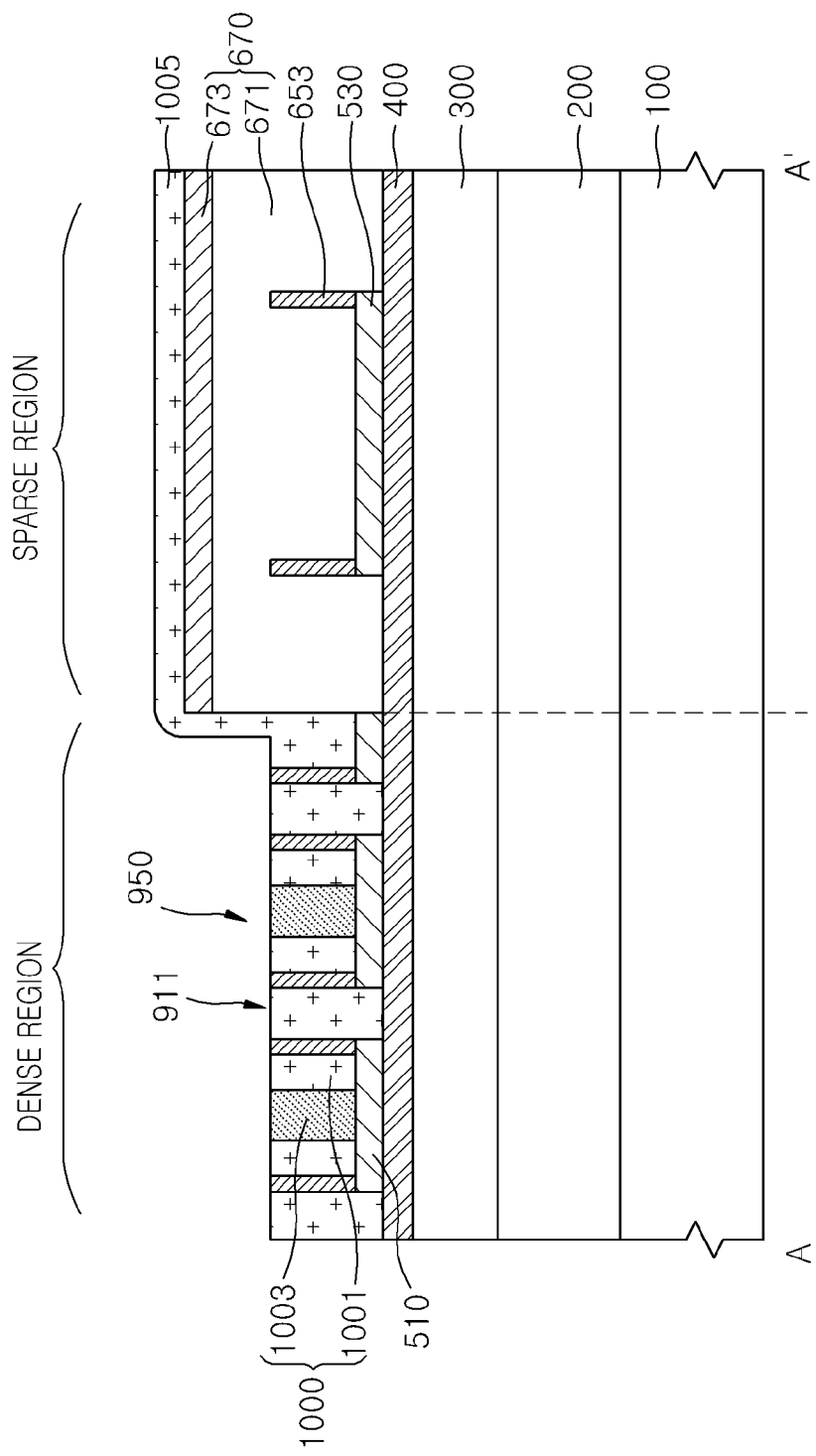

Referring to FIGS. 13 and 14, the substrate including the blocking layer 670 may be coated with a BCP material having a liquid phase to form a BCP layer 1000 in the dense region and a BCP layer 1005 in the sparse region. As a result, the first openings 911 surrounded by the first guide elements 651 and the concave regions 950 located outside the first openings 911 may be filled with the BCP layer 1000. The BCP layer 1000 may be formed by coating the semiconductor with copolymer comprising two or more polymers, such as a polystyrene-polymethylmethacrylate (PS-PMMA) co-polymer material, or a silicon-based co-polymer such as polystyrene-polydimethylsiloxane(Si contained PS-PDMS).

In some embodiments, the BCP layer 1000 may include polystyrene (PS) blocks and polymethylmethacrylate (PMMA) blocks, and a volume ratio of the PS blocks to the PMMA blocks may be about 7:3. In an embodiment, the polymer blocks have a high etch selectivity with respect to one another under certain etching conditions, so that an etching process which removes domains of a first polymer block does not remove domains of a second polymer block. The polymers of the BCP material have different chemical structures, which result in different properties. Properties such as solubility that vary between the polymer blocks may contribute to the susceptibility of the BCP to thermal phase separation and selective dissolution in a liquid or solid state to form a self-assembled structure.

When a BCP layer consisting of two distinct polymer blocks is self-assembled on a substrate, the resulting self-assembled structure may have a three dimensional cubic shape, a three dimensional double helix shape, a two dimensional hexagonal packed column shape or a two dimensional lamella shape. Factors that influence the shape of the BCP layer include a volume ratio between polymer blocks, an annealing temperature for phase separation and molecular sizes of the polymer blocks constituting the BCP layer. A size of each polymer block in the various self-assembled structures may be proportional to a molecular number (MN) of the corresponding polymer block. The first hard mask pattern 510 may function as a neutral layer in order to align the polymer block of the BCP layer 1000.

In some embodiments, the BCP layer 1000 may be formed of polybutadiene-polybutylmethacrylate co-polymer, polybutadiene-polydimethylsiloxane co-polymer, polybutadiene-polymethylmethacrylate co-polymer, polybutadiene-polyvinylpyridine co-polymer, polybutylacrylate-polymethylmethacrylate co-polymer, polybutylacrylate-polyvinylpyridine co-polymer, polyisoprene-polyvinylpyridine co-polymer, polyisoprene-polymethylmethacrylate co-polymer, polyhexylacrylate-polyvinylpyridine co-polymer, polyisobutylene-polybutylmethacrylate co-polymer, polyisobutylene-polymethylmethacrylate co-polymer, polyisobutylene-polybutylmethacrylate co-polymer, polyisobutylene-polydimethylsiloxane co-polymer, polybutylmethacrylate-polybutylacrylate co-polymer, polyethylethylene-polymethylmethacrylate co-polymer, polystyrene-polybutylmethacrylate co-polymer, polystyrene-polybutadiene co-polymer, polystyrene-polyisoprene co-polymer, polystyrene-polydimethylsiloxane co-polymer, polystyrene-polyvinylpyridine co-polymer, polyethylethylene-polyvinylpyridine co-polymer, polyethylene-polyvinylpyridine co-polymer, polyvinylpyridine-polymethylmethacrylate co-polymer, polyethyleneoxide-polyisoprene co-polymer, polyethyleneoxide-polybutadiene co-polymer, polyethyleneoxide-polystyrene co-polymer, polyethyleneoxide-polymethylmethacrylate co-polymer, polyethyleneoxide-polydimethylsiloxane co-polymer, or polystyrene-polyethyleneoxide co-polymer.

The BCP layer 1000 may be phase-separated to form first domains 1001 and second domains 1003 surrounded by the first domains 1001. The phase separation of the BCP layer 1000 may be achieved by annealing the BCP layer 1000 at a temperature exceeding the glass transition temperature Tg of the BCP layer 1000 to rearrange and align the polymer blocks of the BCP layer 1000. For example, the BCP layer 1000 may be annealed at a temperature of about 100 degrees Celsius to about 190 degrees Celsius for about one hour to about twenty four hours to rearrange and align the polymer blocks of the BCP layer 1000. Annealing times and temperatures may vary depending on the particular BCP material.

Referring again to FIGS. 13 and 14, after the BCP layer 1000 is phase-separated, the first domains 1001 and the second domains 1003 surrounded by the first domains 1001 may be formed in the concave regions 950. In particular, as discussed above, because a distance between adjacent first guide elements 651 arrayed along diagonal lines in a plan view is greater than a distance between adjacent first guide elements 651 in row and column directions, one of the polymer blocks may be separated into positions on diagonal lines between the first guide elements 651. In other words, with respect to a tetragon connecting four orthogonally arrayed first guide elements 651 that are nearest neighbors to one another, one of the phases of the BCP layer may separate to a space in the center of the tetragon, where the distance between first guide elements 651 is greatest. The tetragon may also be described as having sides that are lines between two adjacent pairs of adjacent first guide elements 651 in the column direction, and lines between the same two adjacent pairs of adjacent first guide elements 651 in the row direction.

In contrast, the BCP layer 1000 may not phase separate in the first openings 911 so that portions of the BCP material in the first openings 911 may include both polymer phases intertwined with one another. In another embodiment, only one of the domains such as first domain 1001 is deposited in the first openings 911. Similarly, both phases of the BCP layer may be present between guide elements 651 that are adjacent to one another in a row direction or a column direction, or only one domain such as first domain 1001 may be present in the spaces. Although FIG. 14 illustrates an example in which top surfaces of the first guide elements 651 are exposed, embodiments are not limited thereto. For example, the top surfaces of the first guide elements 651 may be covered with the BCP layer 1000. As described above, in an embodiment, each of the first openings 911 may be filled with only the first domain 1001 and each of the concave regions 950 may be filled with both of the first and second domains 1001 and 1003 which are generated by a phase separation of the BCP layer 1000. That is, the second domains 1003 may be formed the concave regions 950 between the first guide elements 651 arrayed along diagonal lines in a plan view.

The second domains 1003 may be formed in central portions of the concave regions 950 based on a relative content of a polymer block (e.g., the PMMA component) of the BCP layer 1000. In some embodiments, the second domains 1003 may be formed in concave regions defined by three adjacent first guide elements 651 in an array of the first guide elements 651 if the concave regions surrounded by three adjacent first guide elements 651 have sufficient space for phase separation of the BCP layer 1000. The second domains 1003 may be separated from each other by the first domain 1001, as illustrated in FIG. 13. In some embodiments, the first domain 1001 may include PS blocks which are phase-separated from the BCP layer 1000 and the second domain 1003 may include PMMA blocks which are phase-separated from the BCP layer 1000.

The BCP layer 1005 on the blocking layer 670 may also be phase-separated while the BCP layer 1000 in the dense region is phase-separated to form the first and second domains 1001 and 1003. However, the blocking layer 670 may prevent geometric patterns formed by the phase separation of the BCP layer 1005 in the sparse region from be transferred to the underlying layers. That is, the second hard mask patterns 530 may be free from a direct self-assembly of the BCP layer 1005 because of the presence of the blocking layer 670.

Figure 15:
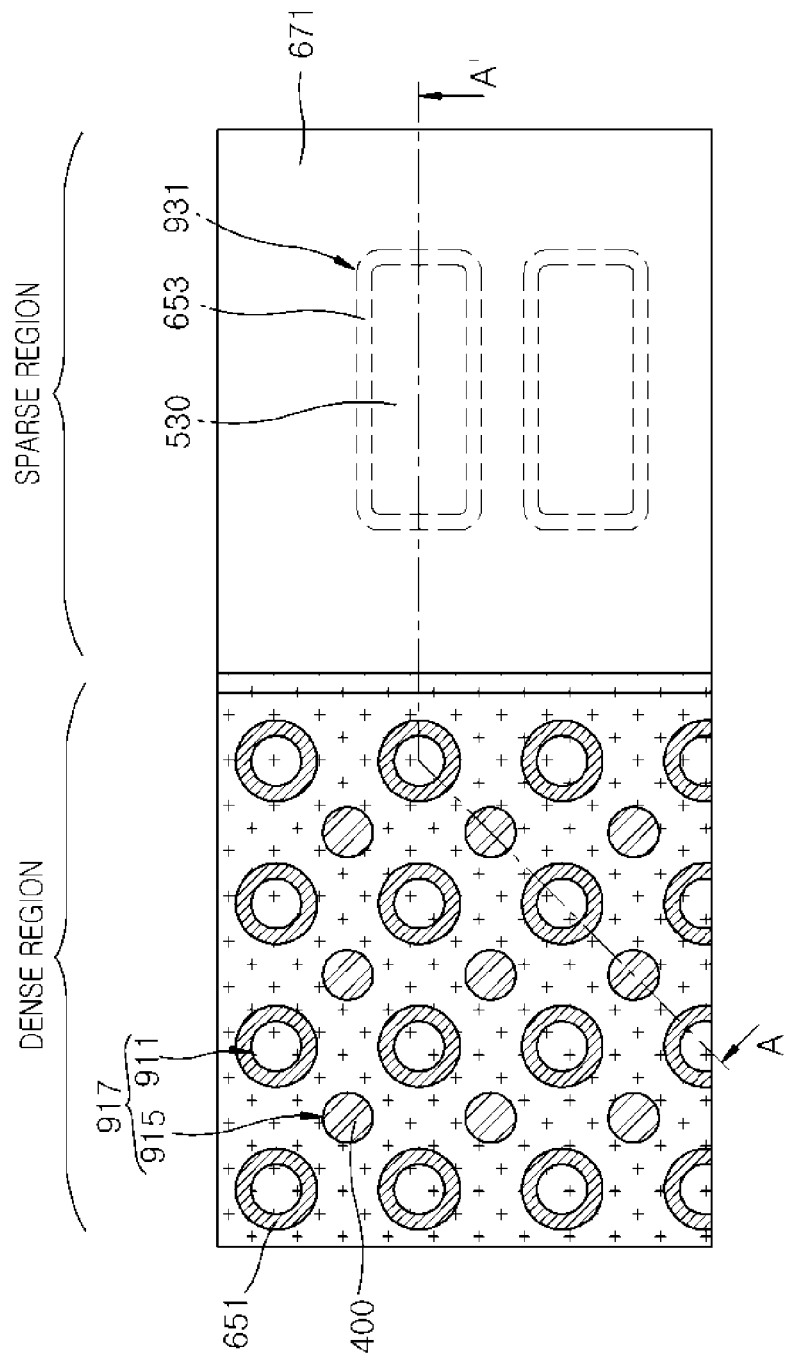
Figure 16:
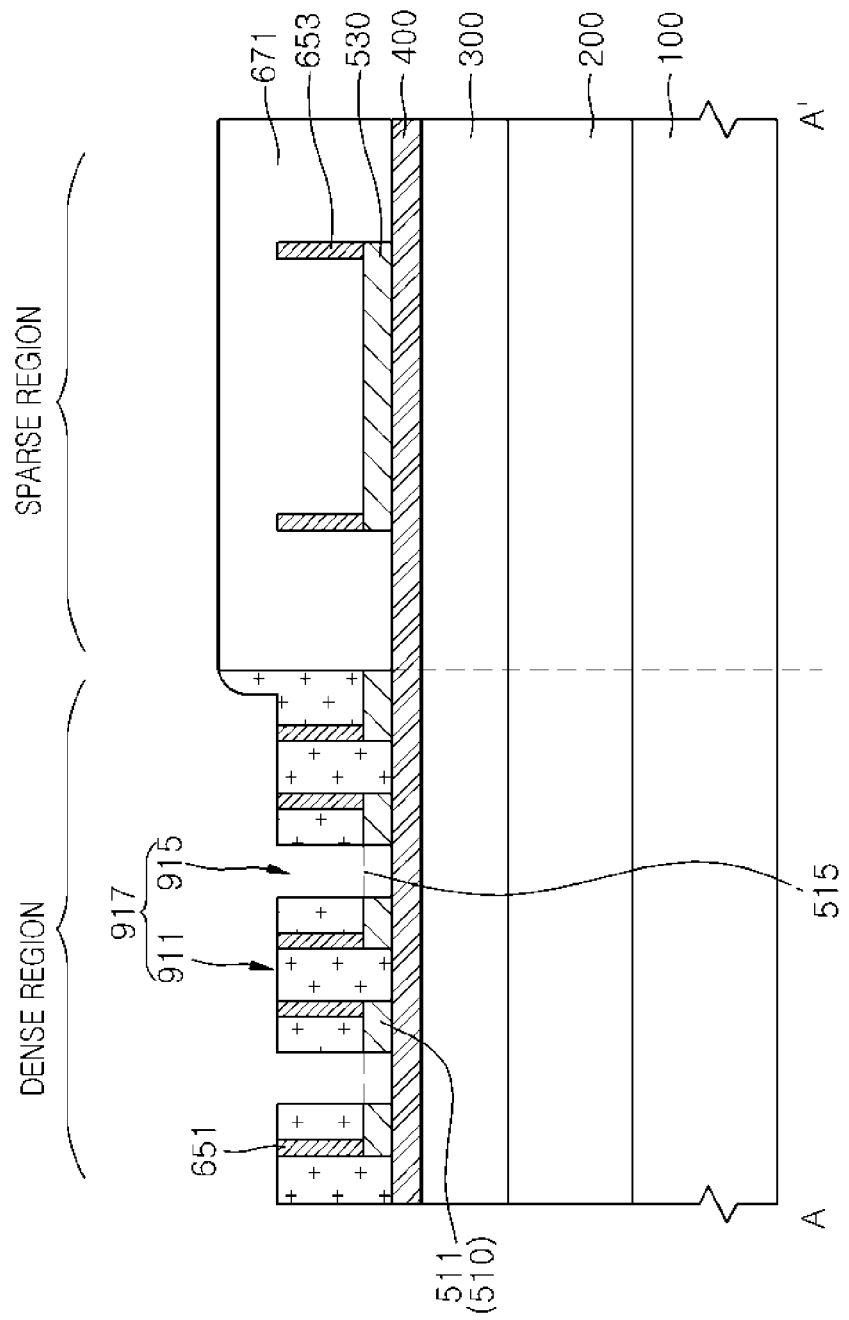

Referring to FIGS. 15 and 16, the second domains 1003 may be removed to form second openings 915 in the dense region. In an embodiment, the second openings 915 may be formed by selectively removing the PMMA blocks which are generated by a phase separation of the BCP layer 1000. In an embodiment, the BCP layer 1005 on the blocking layer 670 may also be removed.

After the second domains 1003 are removed, exposed portions 515 of the first hard mask pattern 510 may be etched using the first domains 1001 as etch masks. As a result, the second openings 915 may be extended to penetrate the first hard mask pattern 510, thereby forming first hard mask patterns 511 which provide second openings 915. Thus, as seen in the plan view of FIG. 15, the first and second openings 911 and 915 may be alternately and repeatedly arrayed along diagonal lines. The combination of the first and second openings 911 and 915 may be referred to as openings 917.

While the second openings 915 are formed using a phase separation of the BCP layer 1000, the second hard mask patterns 530 may still maintain their original shapes because of the presence of the blocking layer 670, for example, the high temperature SOC layer 671. In the etching process that removes portions of the first hard mask pattern 510 to form the second openings 915 penetrating the first hard mask pattern 511, the USG layer 673 of the blocking layer 670 may also be removed but the high temperature SOC layer 671 may still remain. Thus, the second hard mask patterns 530 may still maintain their original shapes even though portions of the first hard mask pattern 510 are etched to form the second openings 915.

Figure 17:
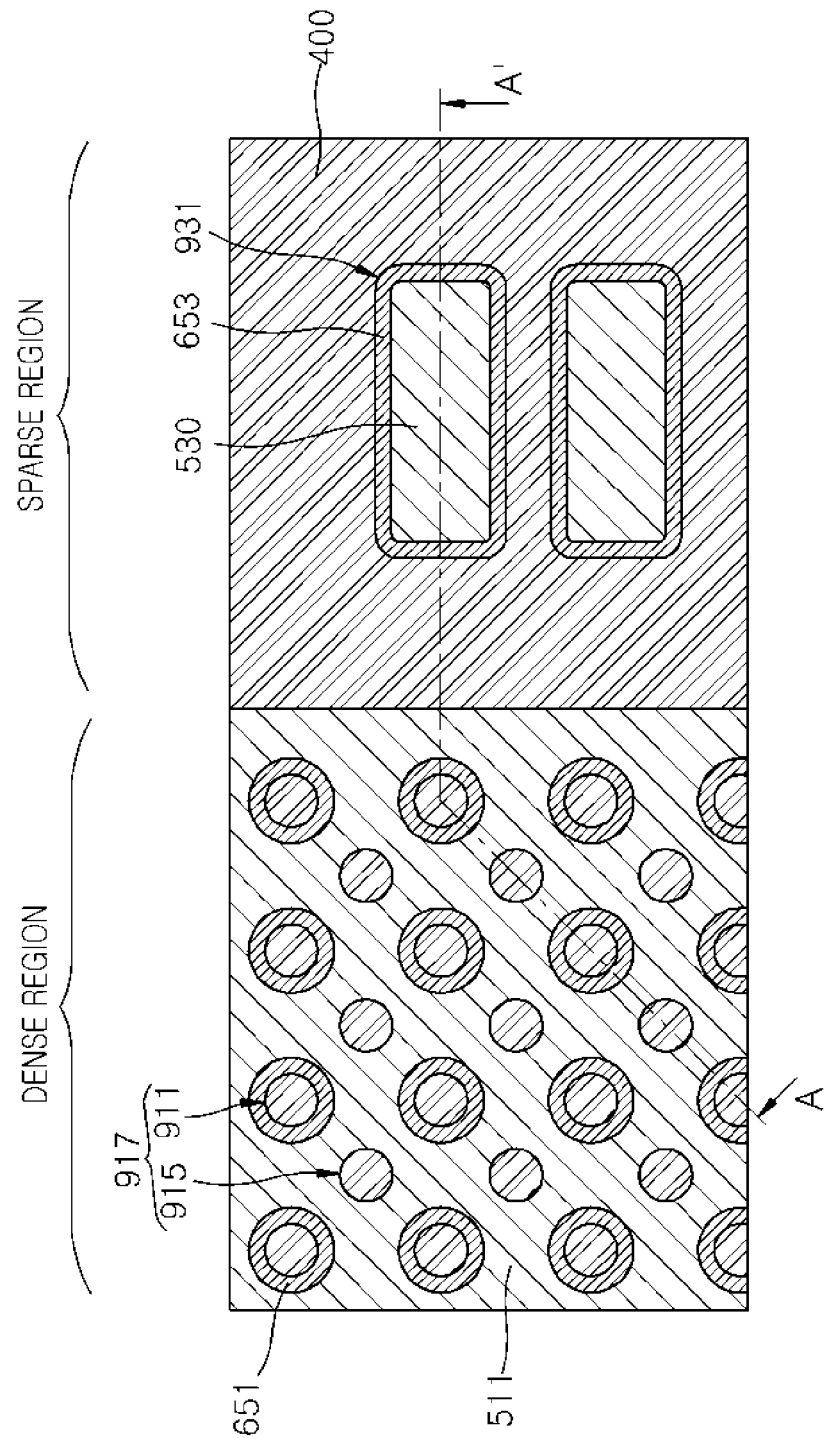
Figure 18:
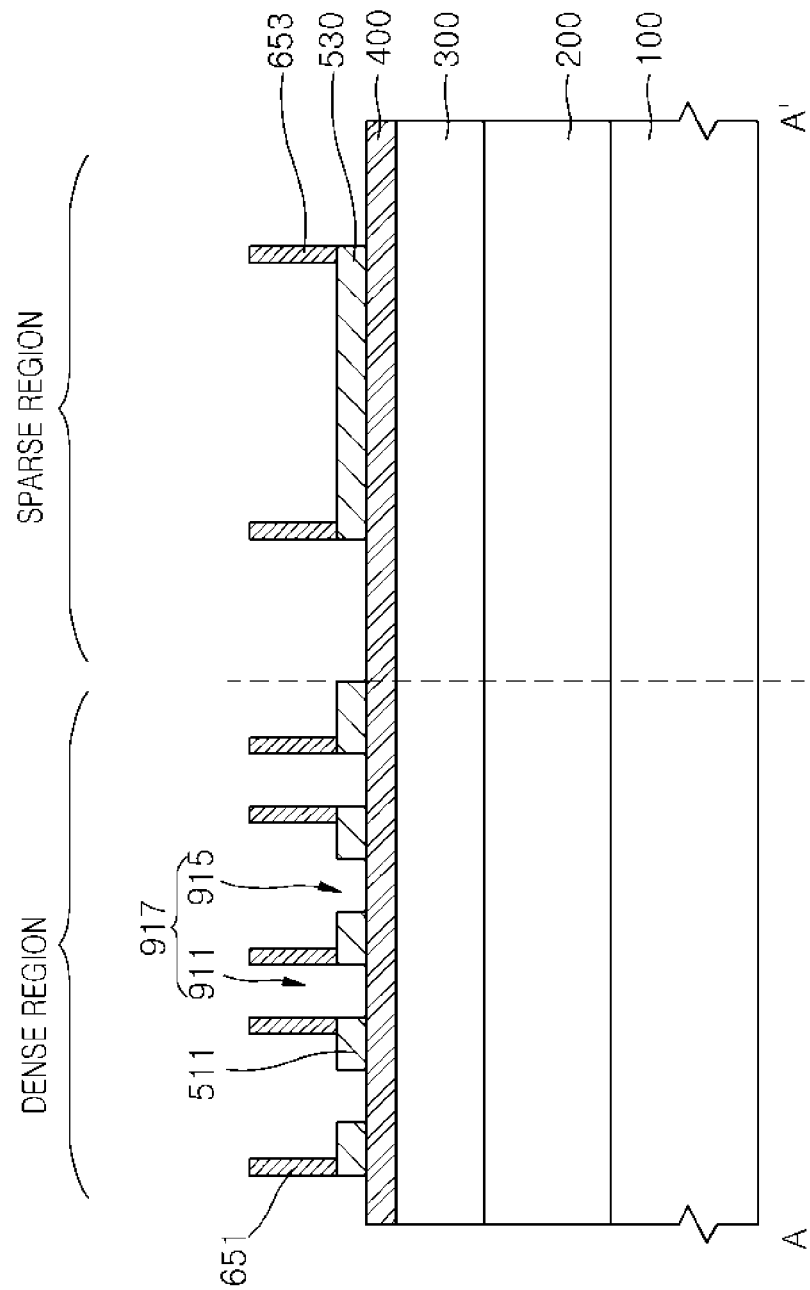

Referring to FIGS. 17 and 18, the remaining first domains 1001 and the high temperature SOC layer 671 may be removed to expose portions of the first hard mask pattern 511 that define the openings 917 including first and second openings 911 and 915 and the second hard mask patterns 530 corresponding to shapes of the isolated patterns 931. In various embodiments, the guide elements 651 and 653 may be removed or may remain during removal of the first domains 1001 and the high temperature SOC layer 671. In an embodiment in which the guide elements 651 and 653 remain during removal of the first domains 1001 and the high temperature SOC layer 671, the guide elements 651 and 653 may be removed in a subsequent etch process.

Figure 19:
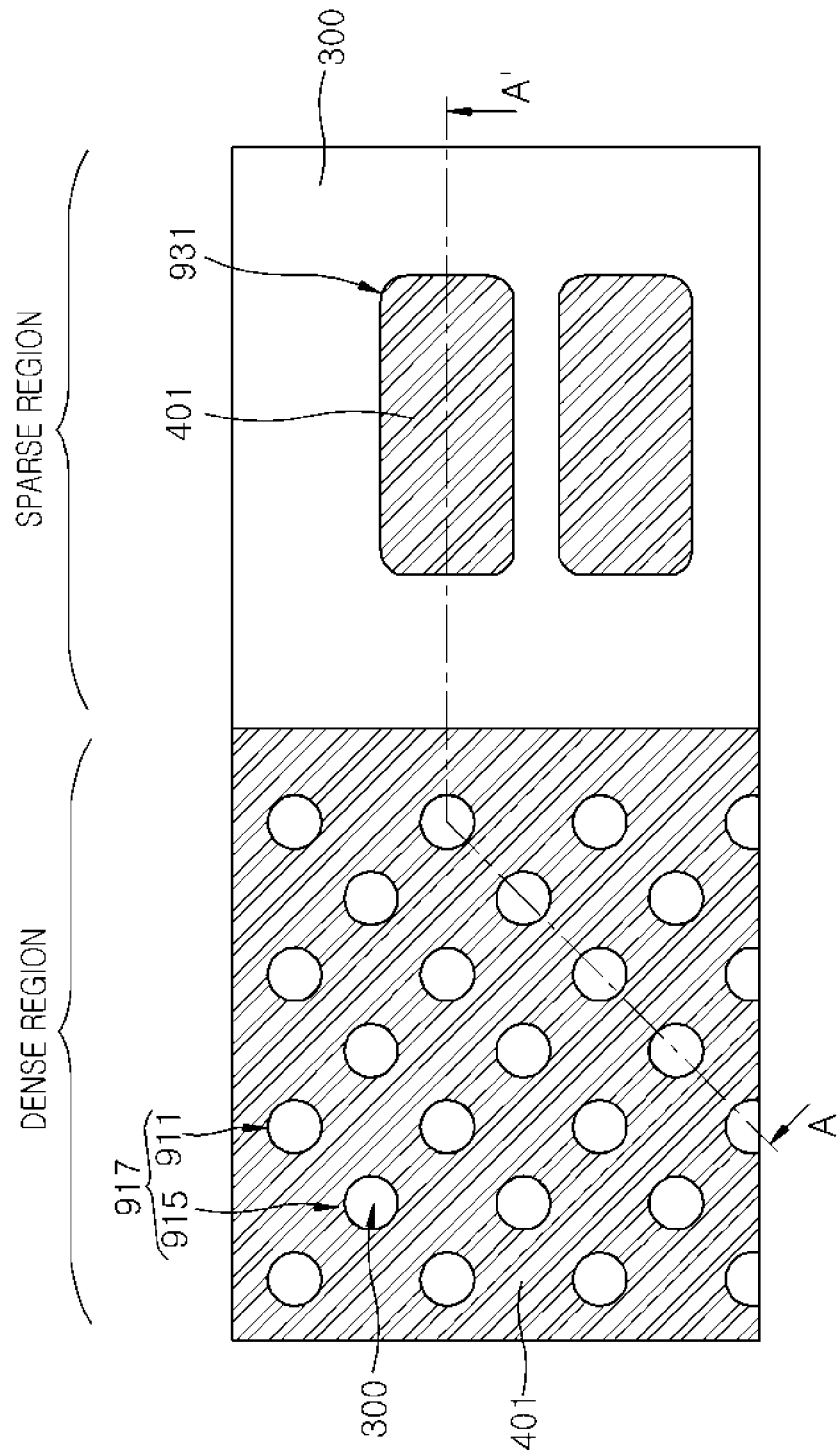
Figure 20:
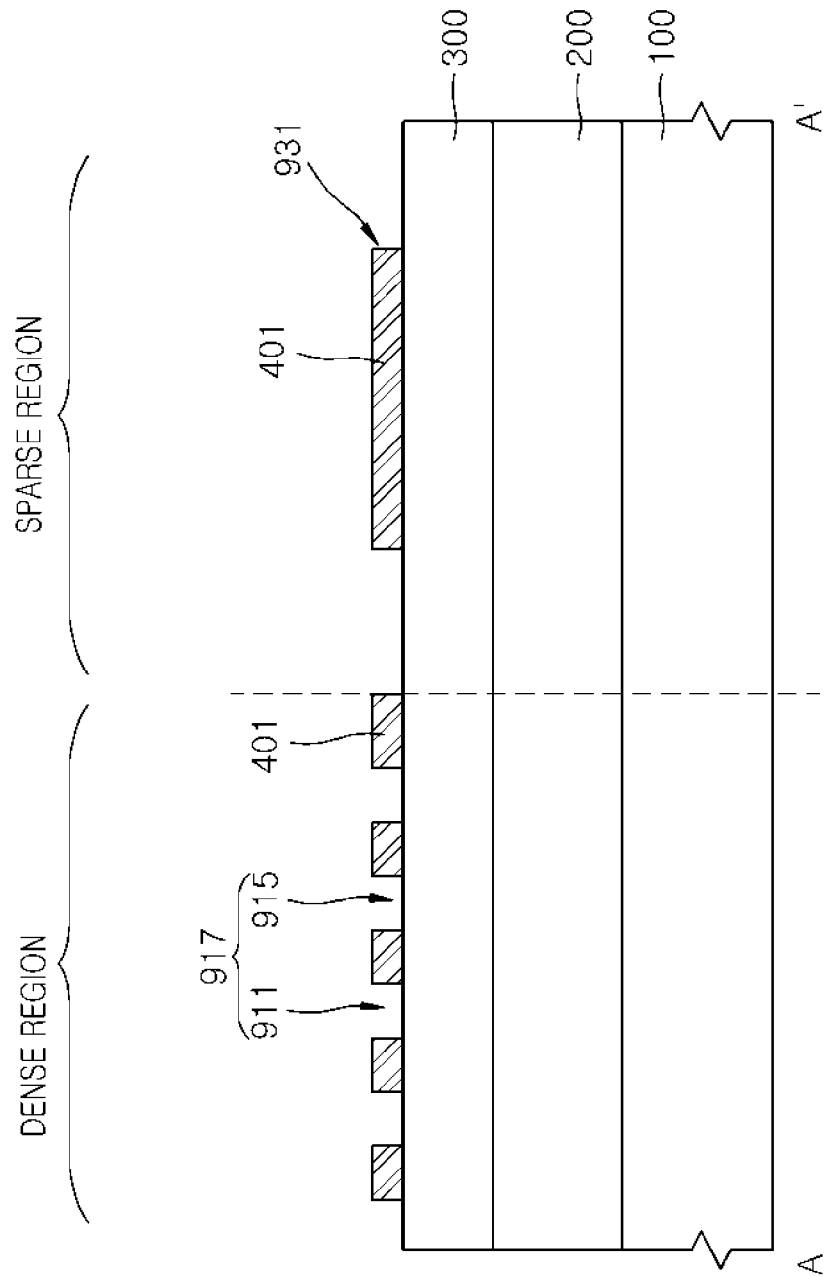

Referring to FIGS. 19 and 20, the second etch mask layer 400 may be etched using the first and second hard mask patterns 511 and 530 as etch masks, thereby forming second etch mask patterns 401. The second etch mask patterns 401 in the sparse region may correspond to isolated patterns 931, and the second etch mask pattern 401 in the dense region may define the openings 917. Although not shown in the drawings, the first etch mask layer 300 may be etched using the second etch mask patterns 401 as etch masks to form first etch mask patterns, and the etch target layer 200 may be etched using the first etch mask patterns as etch masks to transfer the pattern images of the openings 917 and the isolated patterns 931 into the etch target layer 200. As a result, holes corresponding to the openings 917 may be formed in the etch target layer 200 of the dense region, and patterns corresponding to the isolated patterns 931 may be formed in the etch target layer 200 of the sparse region.

Methods of fabricating the holes corresponding to the openings 917 may be used to form contact holes of various semiconductor devices. For example, the processes described in the above embodiments may be used in formation of an array of storage node contact holes of DRAM devices or an array of lower electrodes contact holes of ReRAM devices. The patterns formed in the sparse region to correspond to the isolated patterns 931 may be used to form various conductive interconnection lines or various conductive pads.

According to the embodiments described above, nano-scale structures or nano structures may be readily fabricated on a large-sized substrate using a phase separation technique of a block co-polymer (BCP) layer. The nano-sclae structures may be used in fabrication of polarizing plates or in formation of reflective lenses of reflective liquid crystal display (LCD) units. The nano structures may also be used in fabrication of separate polarizing plates as well as in formation of polarizing parts including display panels. For example, the nano structures may be used in fabrication of array substrates including thin film transistors or in processes for directly forming the polarizing parts on color filter substrates. Further, the nano structures may be used in molding processes for fabricating nanowire transistors or memories, electronic/electric components for patterning nano-scaled interconnections, catalysts of solar cells and fuel cells, etch masks, organic light emitting diodes (OLEDs), and gas sensors.

Methods according to the aforementioned embodiments and structures formed thereby may be used in fabrication of integrated circuit (IC) chips. The IC chips may be supplied to users in a raw wafer form, in a bare die form or in a package form. The IC chips may also be supplied in a single package form or in a multi-chip package form. The IC chips may be integrated in intermediate products such as mother boards or end products to constitute signal processing devices. The end products may include toys, low end application products, or high end application products such as computers. For example, the end products may include display units, keyboards, or central processing units (CPUs).

While embodiments of the present disclosure have been particularly shown and described with reference to specific examples, it will be understood that various changes in form and details may be made therein without departing from the spirit and scope of the following claims.

What is claimed is:

1. A method of fabricating a nano-scale structure, the method comprising:
    forming a first preliminary mask pattern defining first openings and second preliminary mask patterns providing isolated patterns on a hard mask layer;
    forming first guide elements on sidewalls of the first openings and second guide elements on sidewalls of the second preliminary mask patterns;
    etching the hard mask layer using the first and second guide elements and the first and second preliminary mask patterns as etch masks to form a first hard mask pattern into which the first openings extend and second hard mask patterns having shapes of the isolated patterns;
    removing the first and second preliminary mask patterns;
    forming a blocking layer covering the second hard mask patterns;
    forming a block co-polymer layer filling the first openings having sidewalls defined by the first guide elements and spaces between the first guide elements; and
    phase-separating the block co-polymer layer to form first and second domains in the spaces between the first guide elements.

2. The method of claim 1, further comprising:
    removing the second domains to expose portions of the first hard mask pattern; and
    etching the exposed portions of the first hard mask pattern to form second openings between the first openings.

3. The method of claim 1, wherein each of the first openings has a hole shape.

4. The method of claim 1,
    wherein each of the first openings has a hole shape, and
    wherein each of the first openings have substantially the same size, and the first openings are regularly arrayed with a predetermined pitch.

5. The method of claim 1,
    wherein each of the first openings has a trench line shape or a groove line shape, and
    wherein each of the first openings have substantially the same size, and the first openings are regularly arrayed with a predetermined pitch.

6. The method of claim 1,
    wherein the isolated patterns are spaced apart from each other by a distance which is greater than a distance between the first openings, and
    wherein the isolated patterns have isolated line shapes.

7. The method of claim 1, wherein the first and second preliminary mask patterns are simultaneously formed using a single patterning step.

8. The method of claim 1, wherein the first and second preliminary mask patterns are formed using a single photolithography step that is performed with a single photo mask and a single etch step.

9. The method of claim 1, wherein forming the first and second preliminary mask patterns includes:
    forming a preliminary mask layer on the hard mask layer;
    forming a photoresist layer on the preliminary mask layer;
    forming a photoresist pattern defining the first openings and the isolated patterns; and
    etching the preliminary mask layer using the photoresist pattern as an etch mask.

10. The method of claim 1, wherein the first and second preliminary mask patterns include a spin on carbon layer.

11. The method of claim 1, wherein forming the first and second guide elements includes:
    forming a guide layer covering the first and second preliminary mask patterns; and
    anisotropically etching the guide layer to form spacers on sidewalls of the first openings and on sidewalls of the second preliminary mask patterns.

12. The method of claim 1,
    wherein the first guide elements are arrayed such that a distance between the first guide elements arrayed along a diagonal line is greater than a distance between the first guide elements arrayed in a row direction or a column direction with respect to a plan view; and
    wherein the second domains are formed at central portions of spaces between the first guide elements arrayed along the diagonal line.

13. The method of claim 12, wherein each of the first guide elements has a cylindrical shape that defines an upper portion of the first opening, and
    wherein the first opening has a hole shape.

14. The method of claim 13, wherein each of the second domains is located at a central portion of a triangle defined by three adjacent first guide elements or a tetragon defined by four adjacent first guide elements.

15. A method of fabricating a nano-scale structure, the method comprising:
    providing a first hard mask pattern defining lower portions of first openings, first guide elements disposed on the first hard mask pattern and aligned with the lower portions of the first openings, and second hard mask patterns corresponding to isolated patterns;
    forming a blocking layer covering the second hard mask patterns;
    forming a block co-polymer layer filling the first openings and a space between the first guide elements; and
    phase-separating the block co-polymer layer to form a first domain and second domains in the space between the first guide elements.

16. The method of claim 15, further comprising:
    removing the second domains to expose portions of the first hard mask pattern; and
    etching the exposed portions of the first hard mask pattern to form second openings located between the first openings.

17. The method of claim 15,
    wherein the isolated patterns are spaced apart from each other by a distance which is greater than a distance between the first openings, and
    wherein the isolated patterns have isolated line shapes.

18. The method of claim 15,
    wherein the first guide elements are arrayed such that a distance between the first guide elements arrayed along a diagonal line is greater than a distance between the first guide elements arrayed in a row direction or a column direction with respect to a plan view; and
    wherein the second domains are formed at central portions of spaces between the first guide elements arrayed along the diagonal line.

19. The method of claim 15, wherein each of the first guide elements has a cylindrical shape that defines a portion of the first opening, and
    wherein the first opening has a hole shape.

20. A method of fabricating a nano-scale structure, the method comprising:

provide a first hard mask pattern defining lower portions of first openings in a dense region;

providing first guide elements on the first hard mask pattern, the first guide elements defining upper portions of the lower portions of the first openings;

providing second hard mask patterns in a sparse region, each second hard mask pattern corresponding to an isolated pattern;

forming a blocking layer covering the second hard mask patterns in the sparse region; and forming a first domain and second domains in the dense region using a phase separation of a block co-polymer layer.

* * * * *